United States Patent [19]
Tsai

[11] Patent Number: 5,468,299
[45] Date of Patent: Nov. 21, 1995

[54] DEVICE COMPRISING A FLAT SUSCEPTOR ROTATING PARALLEL TO A REFERENCE SURFACE ABOUT A SHAFT PERPENDICULAR TO THIS SURFACE

[76] Inventor: Charles S. Tsai, 2653 S. Daytona Ave., Hacienda Hts., Calif.

[21] Appl. No.: 370,167

[22] Filed: Jan. 9, 1995

[51] Int. Cl.$^6$ ............................ C23C 16/00; B05C 13/00
[52] U.S. Cl. ............................ 118/730; 118/500; 406/87; 406/88; 406/92; 108/138
[58] Field of Search .................................... 118/730, 500, 118/52, 320; 406/86, 87, 88, 92; 104/23.2; 108/20, 104, 138; 269/20, 57, 903; 204/298.12

[56] References Cited

U.S. PATENT DOCUMENTS

| | | | |
|---|---|---|---|
| 3,332,656 | 7/1967 | Johnson | 248/349 |
| 3,662,708 | 5/1972 | Shrader | 118/49 |
| 3,783,822 | 1/1974 | Wollam | 118/49.1 |
| 3,797,452 | 3/1974 | Dobson | 118/49 |
| 4,386,255 | 5/1983 | Berkman | 219/10.49 R |
| 4,512,284 | 4/1985 | Robinson | 118/723 |
| 4,793,911 | 12/1988 | Kemmerer | 204/298 |
| 4,860,687 | 8/1989 | Frijlink | 118/500 |
| 4,945,774 | 8/1990 | Beard | 73/863.11 |
| 5,010,563 | 4/1991 | Laurent | 378/132 |
| 5,113,102 | 5/1992 | Gilmore | 310/88 |

OTHER PUBLICATIONS

Philips Power Semiconductor Applications, 1991, pp. 3–65 to 3–78, by Philips Semiconductors.

*Primary Examiner*—R. Bruce Breneman
*Assistant Examiner*—Jeffrie R. Lund

[57] ABSTRACT

A device comprising a flat susceptor (14) rotating parallel to a reference surface (30) about a rotary shaft (20) perpendicular to this surface and comprising means for obtaining the stability of the susceptor held in sustentation and means for obtaining its rotary movement, is characterized in that these means are constituted by the ferromagnetic elements (11) in the susceptor, of the rotary shaft, of the reference surface, of a magnetic actuating assembly (70), and of a gas inlet (40).

12 Claims, 10 Drawing Sheets

DEVICE COMPRISING A FLAT SUSCEPTOR ROTATING PARALLEL TO A REFERENCE SURFACE ABOUT A SHAFT PERPENDICULAR TO THIS SURFACE

BACKGROUND

1. Field of Invention

The invention relates to a device comprising a flat susceptor rotating parallel to a reference surface about a shaft perpendicular to this surface and comprising means for obtaining the stability of the susceptor held in sustentation and means for obtaining and measuring its rotary movement.

The invention further relates to a reactor chamber for vapor-phase epitaxy or chemical-vapor deposition provided with such a device. The invention can be used in the manufacture of flat rotating sample carriers for reactor chambers for vapor-phase epitaxy or chemical-vapor deposition, more particularly for the epitaxial growth from the vapor phase of layers of compounds of the III-V or II-VI group for forming semiconductor devices.

2. Description of Prior Art

The use of rotating sample carriers in the field of epitaxial growth from the vapor phase of the compounds of the III-V group is known from the publication entitled "Multi-Wafer Growth of Extremely Uniform GaAs Layers by Organometallic Vapor Phase Epitaxy" from the Electronic Materials Conference, University of Colorado, Jun. 19–21, 1985, by S. Komeno, H. Tanaka, I. Itoh et al. This publication shows that it is important during the growth of epitaxial layers from the vapor phase to rotate the sample in order to obtain uniform layers and to form components of high quality, such as field effect transistors, semiconductor diode lasers and many others.

Vapor-phase epitaxy imposes stringent requirements on the materials used within the reactor chamber. High temperatures of the order of 900° C. are encountered routinely. High purity environment that is as particle-free as possible is required for the growth of high-quality and low-defect-density epitaxial layers. Highly-reactive and acutely-toxic gas ambients within the reactor chamber dictate the use of inert materials and leak-proof seals. The thermal variations across a susceptor, the difference in rotation rates of different susceptors, the rotation-rate variations from growth to growth, and the gas-flow disturbances and inhomogeneities must be kept to an absolute minimum to obtain highly-uniform epitaxial layers suitable for mass-production.

Susceptor rotation by external motor with mechanical feedthroughs is met with difficulties. The mechanical members traversing the reactor-chamber wall enclosing the acutely-toxic gases require leak-proof mechanical seals operating at high temperatures. Extremely complicated mechanical gearing mechanism for rotating susceptors in the planetary form is difficult to implement, especially when using the non-lubricated refractory materials suitable for the high-temperature, highly-reactive, and acutely-toxic gas ambients.

Susceptor rotation by gas flow in U.S. Pat. No. 4,860,687 to Frijlink, 1989 Aug. 29, was a significant improvement over rotation by external motor with mechanical feedthroughs. Two commercially-available devices are illustrated in two prior-art drawings of FIGS. 1a and 1b. These gas-flow rotation devices eliminated the need for mechanical feedthroughs and high-temperature mechanical seals. A viable planetary form of susceptor rotation was also demonstrated.

In FIG. 1a, a susceptor 14 rotates parallel to a reference surface 30 about a rotary shaft 20 perpendicular to reference surface 30. Susceptor 14 is held in sustentation and caused to rotate in the indicated direction by the action of gas flow through several gas inlets 40a, 40b, and 40c into several helical grooves 51a, 51b, and 51c on reference surface 30. The rotary movement is obtained by a force of viscosity of the gas.

FIG. 1b illustrates the prior-art planetary form of susceptor rotation by gas flow. A main susceptor 14 rotates in the indicated direction. Main susceptor 14 also includes a number of secondary susceptors 114, 214, and 314 on a reference surface 130 facing away from reference surface 30. Secondary susceptor 114 is used as an example applicable to secondary susceptors 214 and 314. Secondary susceptor 114 is held in sustentation and caused to rotate in the indicated direction by the action of gas flow through an additional gas inlet 42 in reference surface 30, a system of gas conduits 43, and several gas inlets 140a, 140b, and 140c into several helical grooves 151a, 151b, and 151c on reference surface 130. Similarly, the rotary movement is obtained by a force of viscosity of the gas.

Despite its significant improvement over rotation by external motor with mechanical feedthroughs, susceptor rotation by gas flow still suffers from many disadvantages as listed below:

(a) The allowable range of rotation rates is limited by the design of grooves 51a, 51b, and 51c, and the available gas-flow range. The minimum rotation rate is constrained by the minimum gas flow required for susceptor sustentation. The maximum rotation rate is constrained by the increase in the gap between the undersurface of susceptor 14 and reference surface 30 with increasing gas flow, where more and more gas flow bypasses grooves 51a, 51b, and 51c entirely, resulting in little or no increase in the rotation rate.

(b) High rotation rates require high gas-flow rates. The large amounts of escaping gases from the gas-flow rotation schemes disrupt significantly the flow of gases in a reactor chamber, causing inhomogeneity and turbulence in the gas flow over the susceptor, resulting in inhomogeneous and defective epitaxial-growth layers.

(c) Rotation rates of susceptors 14, 114, 214, and 314 are difficult to measure in a coated reactor chamber, and are sensitive to the individual machining tolerances of gas inlets 40a, 40b, 40c, 140a, 140b, and 140c, system of gas conduits 43, and grooves 51a, 51b, 51c, 151a, 151b, and 151c. Perfect matching of rotation rates between individual secondary susceptors 114, 214, and 314 in the planetary device is extremely difficult, because the individual rotation rates are not adjustable.

(d) The failure or rate change in the susceptor rotation due to clogging in gas inlets 40a, 40b, 40c, 42, 140a, 140b, or 140c, or in system of gas conduits 43, or due to friction-producing dust particles are not directly detectable except by visual inspection, which is quite difficult to perform with heavily-coated reactor-chamber walls.

(e) The process of starting and stopping rotation generates contaminating particles due to the frictional contact between rotating susceptor 14 and reference surface 30 when the gas-flow inputs start or stop.

(f) Gap between the undersurface of susceptor 14 and reference surface 30 varies with rotation-rate changes. Increasing the rotation rate requires gas-flow increase, which increases the gap. The changes in the gap cause growth temperature variations and produce undesirable effect on epitaxial growth.

(g) At constant mass-flow rates of gas input, the rotation rates of susceptors 14, 114, 214, and 314 vary with the growth temperature and pressure due to changes in the gas viscosity and volume. The calibration of gas-flow rates using each combination of growth temperature, reactor chamber pressure, and rotation rates is required.

(h) Synchronization of susceptor rotation with source-gas switching during epitaxial growth is extremely difficult. Not synchronizing rotation with gas switching results in inhomogeneities in epitaxial-growth layers across the susceptor. This is especially critical for thin layers with layer thicknesses comparable to atomic dimensions.

(i) Angular orientation and position of each susceptor 14, 114, 214, or 314 are not directly detectable except by visual inspection. In an automated production machine, the unsupervised loading and unloading of indexed wafers in a reactor chamber require machine-accessible data on the orientations and positions of individual susceptors.

OBJECTS AND ADVANTAGES

It is accordingly an object of the present invention to eliminate the above disadvantages of susceptor rotation either by external motor with mechanical feedthroughs or by gas flow. Several objects and advantages of the present invention are:

(a) No constraint on minimum rotation rate. The maximum rotation rate is mainly constrained by the design of the magnetic structures and the control electronics.

(b) Escaping gases that disturb the gas flow over the susceptor are minimized. Gas flow is required only for susceptor sustentation.

(c) Rotation rates of susceptors can be determined essentially exactly. Perfect matching of rotation rates between individual susceptors in the planetary device is an inherent characteristic. Different adjustable rotation rates for different susceptors in the planetary device are also possible.

(d) Failures or rate changes in the susceptor rotation due to external influences can be quickly detected with the optional sensors, thereby allowing for possible corrective actions to be taken by the control electronics or a human operator.

(e) The process of starting and stopping rotation generates no contaminating particles, because sustentation of susceptor is independent of the rotation mechanism.

(f) Synchronization of rotation with external events, such as source-gas switching during an epitaxial growth, is simple.

(g) Relative angular orientation and position of each susceptor are known at almost all times with the optional sensors, thereby allowing for device incorporation into automated processing machines.

Other objects of the invention are to provide versatile rotating platforms useful outside of the field of vapor-phase epitaxy. The rotating platform, with or without the substitution of the sustentation means with other bearing means, would allow for extremely complicated rotation patterns with multiple rotation axis without any complicated mechanical gearing or motor systems. The rotating platform could also be used in a liquid environment, since the principles for its operation does not depend on the specific properties of the gas phase.

Further objects and advantages of the invention will become apparent from a consideration of the drawings and ensuing description.

DESCRIPTION OF DRAWINGS

FIG. 10b is a sectional view of the device according to FIG. 10a, FIG. 10c is a plan view of the device according to FIG. 10a.

DESCRIPTION AND OPERATION OF INVENTION

1. Basic Device

In the following description, a platform in the form of a disk will preferably be chosen, although other platforms of different shapes can be utilized equivalently.

Figure 1A:
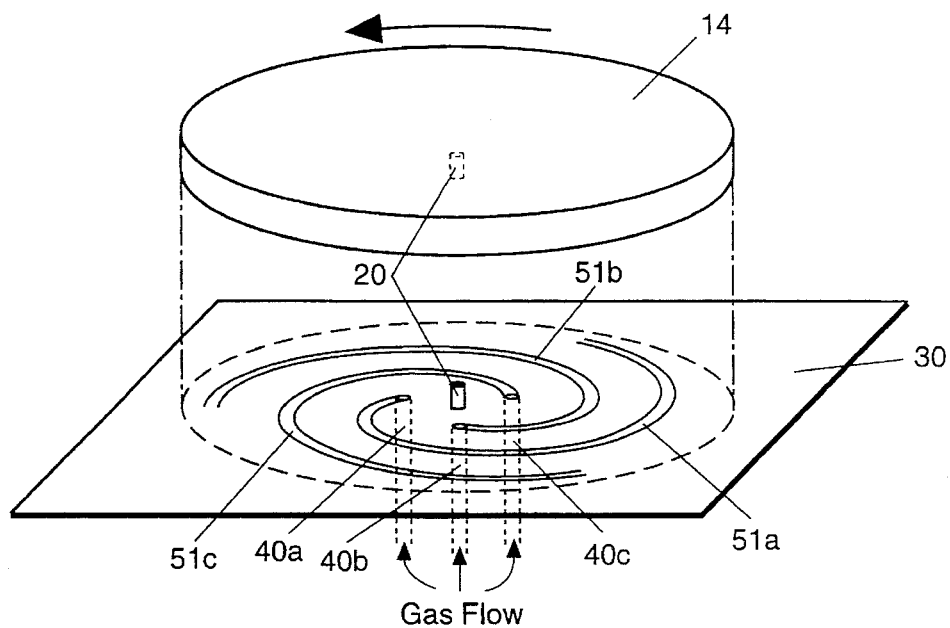
FIG. 1a is a prior-art exploded and perspective view of a device comprising a susceptor provided with a rotary shaft and a system for setting into rotation in which a force of viscosity of a gas is applied.
Figure 1B:
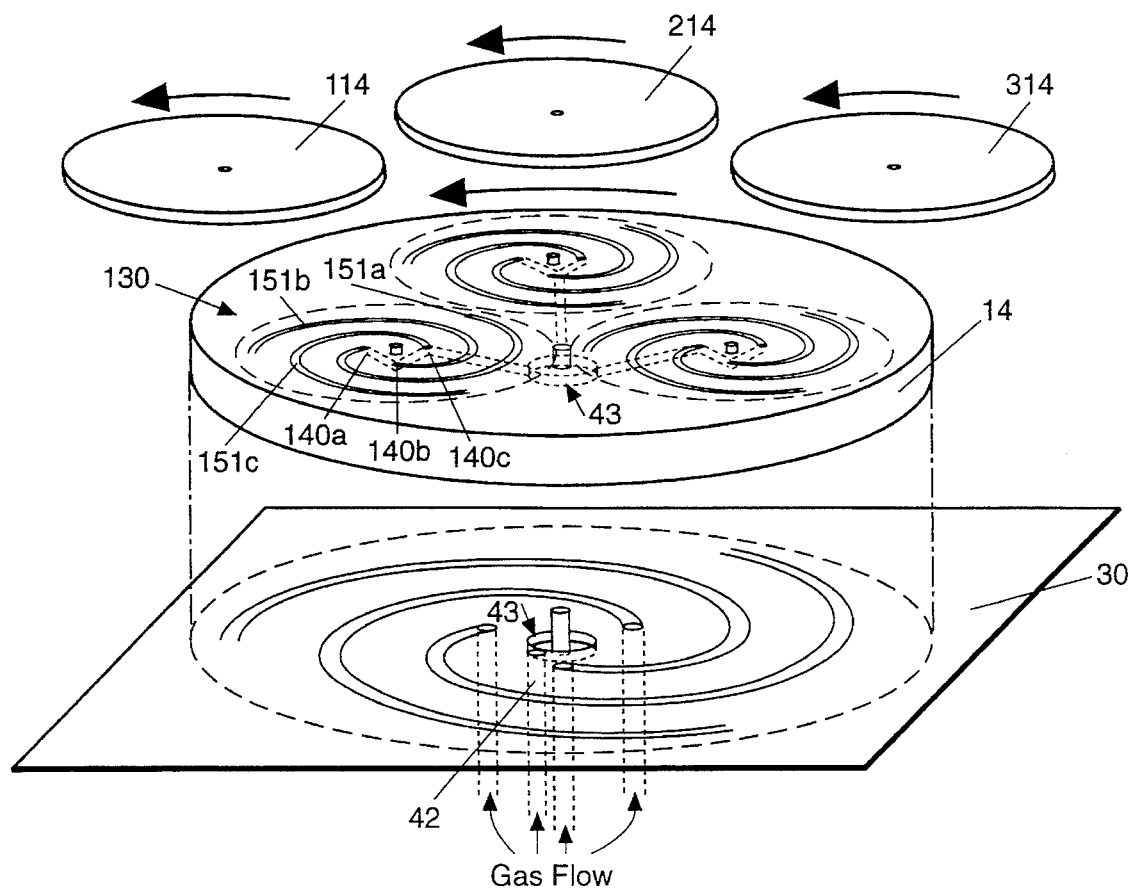
FIG. 1b is a prior-art exploded and perspective view of a device permitting the planetary rotation of several susceptors.
Figure 2A:
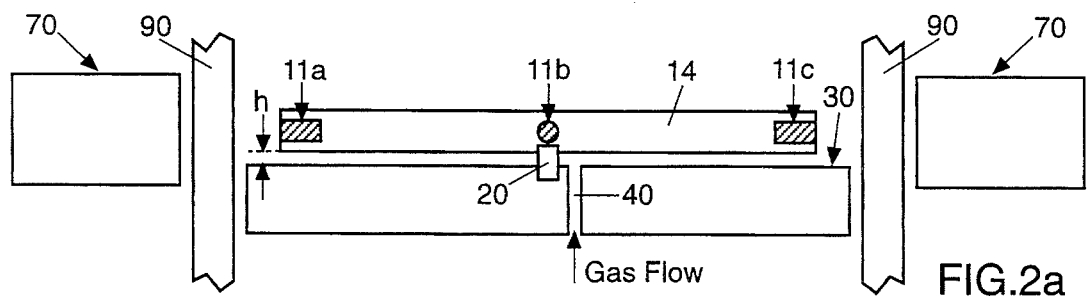
FIG. 2a is a sectional view of a basic device according to the invention.
Figure 2B:
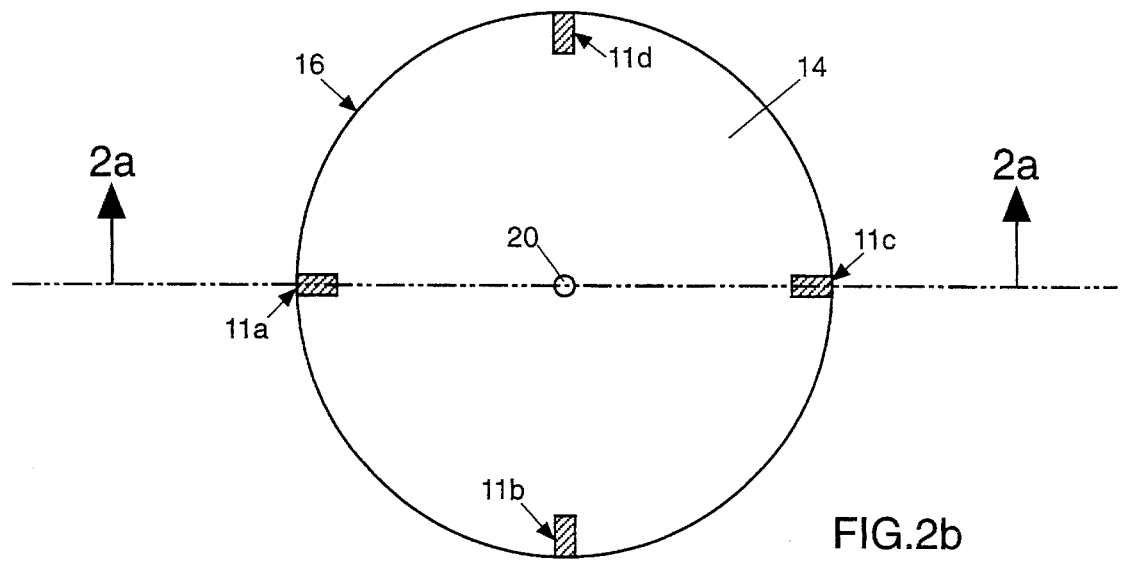
FIG. 2b is a plan view of the susceptor according to FIG. 2a, FIG. 2c is a plan view of the reference surface and the magnetic actuating assembly according to FIG. 2a, FIG. 3a is a perspective view of a second embodiment of a susceptor according to the invention, FIG: 3b is a perspective view of a third embodiment of a susceptor according to the invention.
Figure 2C:
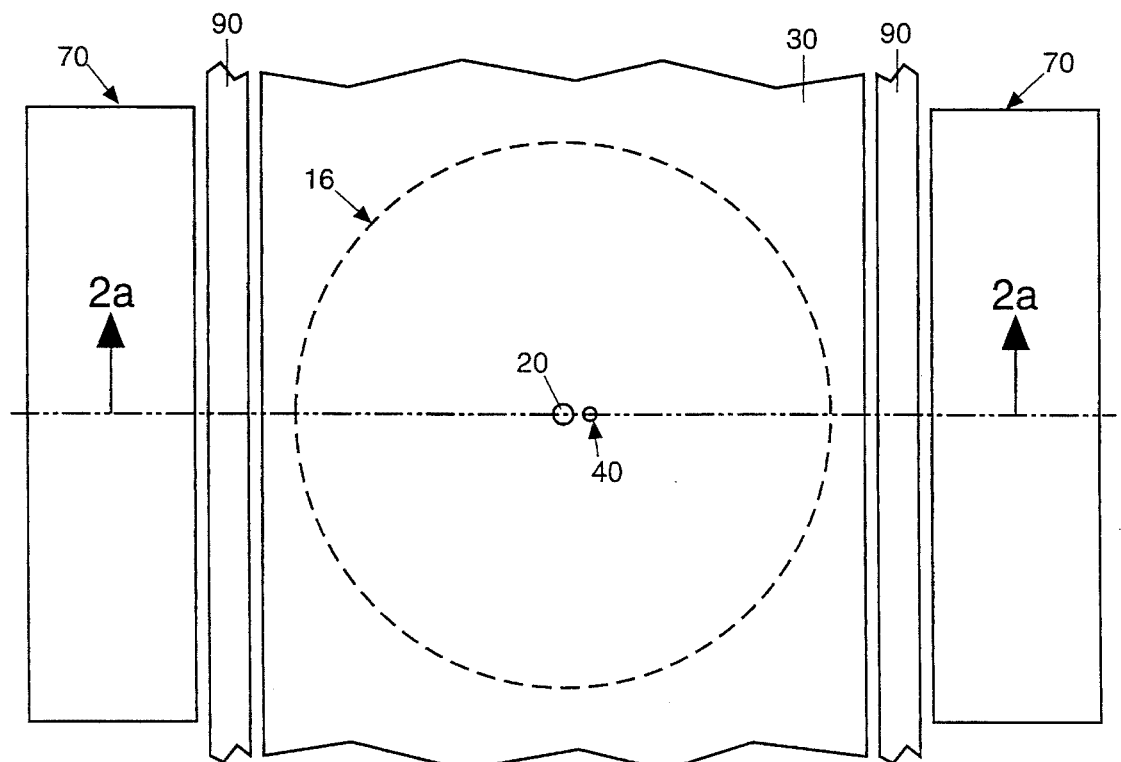

As shown in FIGS. 2a, 2b, and 2c, the basic device according to the invention comprises one or more ferromagnetic elements 11a, 11b, 11c, and 11d of unmagnetized or magnetized ferromagnetic material, such as cobalt (Co), iron (Fe), nickel (Ni), or the alloys of Co, Fe, Ni, and/or other materials, integrated into a platform or a susceptor 14 rotating parallel to a reference surface 30 about a shaft 20 perpendicular to this surface.

According to the invention, platform 14 is held in sustentation above the reference surface 30 with a gap h>0 at all points between the undersurface of platform 14 and reference surface 30 by the action of gas flow through one or more gas inlets 40. Platform 14 is induced to start rotating, to continue rotating, and/or to stop rotating about shaft 20 by the magnetic interactions between ferromagnetic elements 11a, 11b, 11c, 11d and an assembly of magnetic actuating means 70. In addition, actual relative angular orientation and rotation rate of platform 14 could be measured if sensor means are included as a part of assembly 70.

Although not part of the device according to the invention, portions of a reactor-chamber wall 90 are also shown to illustrate the incorporation of the device into a reactor chamber, where assembly 70 is shown positioned outside of the reactor chamber.

In FIGS. 2b and 2c, the edge 16 of platform 14 is also drawn to aid understanding and visualization.

Platform 14 may be formed from any kind of hard materials of low deformation, inclusive of polymers.

For use in an epitaxy chamber, these materials must moreover be refractory. These materials may be: graphite, metals, ceramic materials, crystalline materials, such as silicon, gallium arsenide, sapphire.

All these materials may be used for platform 14, for shaft 20, as well as for reference surface 30.

In the ensuing description, the terms platform and susceptor will be used interchangeably.

2. Ferromagnetic Elements in Susceptor

In the following description, the number of ferromagnetic elements in a susceptor is chosen to be four, for example, although any number one or greater is possible depending on specific application.

There are many possible shapes and structures for the ferromagnetic elements integrated in susceptor 14. As shown in FIGS. 2a and 2b, four ferromagnetic elements 11a, 11b, 11c, and 11d, cylindrical in shape with diameters smaller than the thickness of susceptor 14 and lengths smaller than the radius of susceptor 14, are incorporated at edge 16 of susceptor 14, where the positions are deduced from each other by rotations of $2\pi/n$, where n=4 in this case.

Figure 3A:
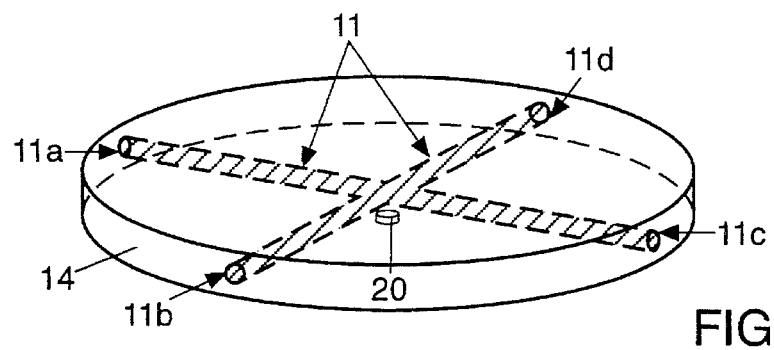
FIG. 3c is a plan view of a fourth embodiment of a susceptor according to the invention.

As shown in FIG. 3a, four ferromagnetic elements 11a, 11b, 11c, and 11d, composing an assembly 11, are also cylindrical with diameters smaller than the thickness of susceptor 14, but with lengths essentially equal to the radius of susceptor 14, allowing for more efficient pathways for magnetic flux through susceptor 14. Positions of the elements are deduced from each other by rotations of $2\pi/n$, where n=4 in this case.

Figure 3B:
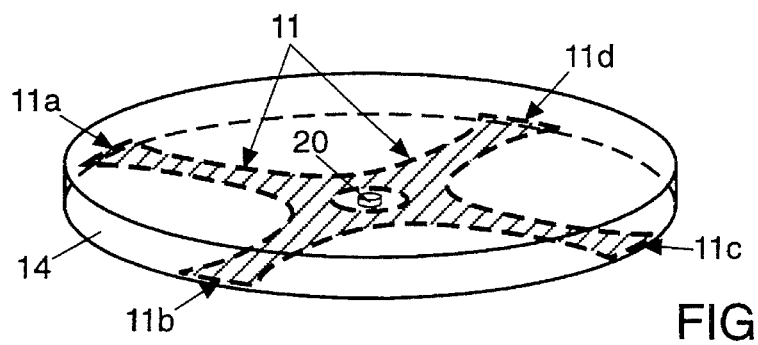

As shown in FIG. 3b, a continuous structure 11 contains four spokes 11a, 11b, 11c, and 11d, which are the ferromagnetic elements. Positions of the spokes are deduced from each other by rotations of $2\pi/n$, where n=4 in this case. This structure resembles the cross section of a rotor in a direct-current brush-less electrical motor. Structure 11 allows for more efficient pathways for magnetic flux through susceptor 14 and yet allows distinct elements required for magnetic actuation.

The ferromagnetic elements may be integrated into susceptor 14 by numerous methods. They can be pushed into tight-fitting holes drilled in susceptor 14. They can be shaped with external screw threads by machining to fit into correspondingly threaded holes in susceptor 14. They can be included in a mold or cast as solid elements if susceptor 14 can be injection-molded or cast at a lower temperature than the melting point of these elements. They can be placed in a sandwich between the top half and the bottom half of susceptor 14 before the two halves are fused together by sintering or by adhesive means. Many other integration methods are possible.

Figure 3C:
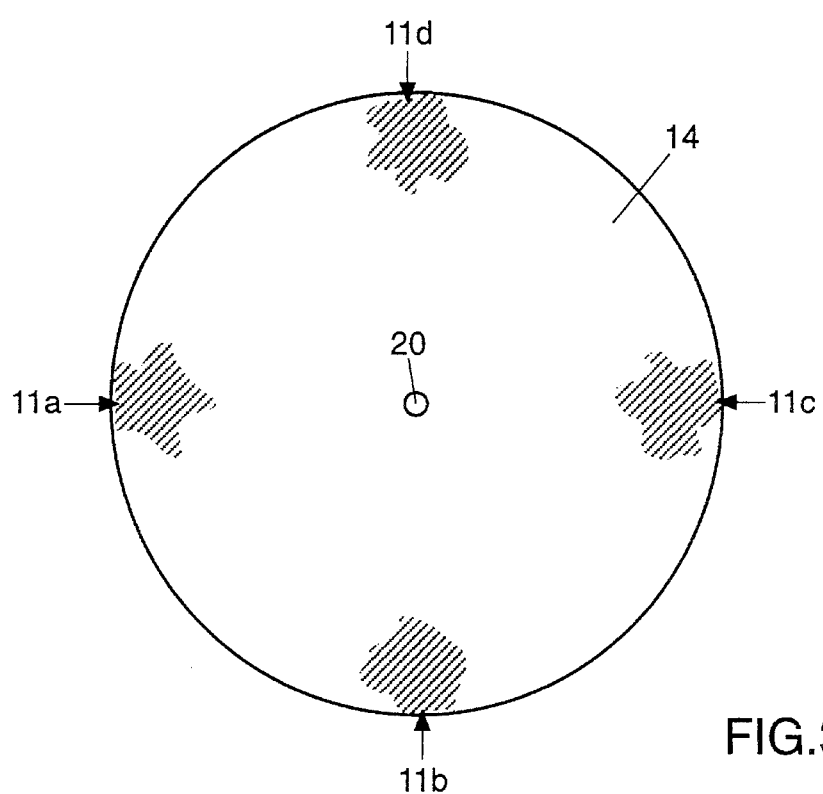

FIG. 3c illustrates the flexibility in the allowed shape of ferromagnetic elements, where four lumps 11a, 11b, 11c, and 11d are distributed radially along the edge of susceptor 14, and spaced from each other by an approximate angle of $2\pi/n$, where n=4 in this case. In this example, the ferromagnetic elements may be formed from ferromagnetic powder molded or cast along with the susceptor in a mold with defined magnetic regions, either as a part of the mold or exterior to the mold, where the ferromagnetic powder preferentially converges and forms individual lumps.

Susceptors shown in FIGS. 2b and 3c are preferred for vapor phase epitaxy, because the ferromagnetic elements are placed at the edge of the susceptor in a zone not intended to receive a sample, thereby minimizing the temperature variations in the susceptor caused by the presence of a different material with different thermal conductivity.

The choices available for the ferromagnetic material for the ferromagnetic elements are restricted by the high temperatures of the order of 900° C. encountered in a reactor chamber. The Curie points, the temperatures above which individual materials lose ferromagnetic properties, dictate the choice of the ferromagnetic materials. Cobalt (Co) with Curie point of ~1131° C. is most preferred along with alloys of Co and other materials. Iron (Fe) with Curie point of ~770° C. is useful for susceptors encountering lower temperatures.

The ferromagnetic elements may be magnetized or unmagnetized. However, in a reactor chamber, unmagnetized ferromagnetic elements is preferred, because magnetized material quickly changes or loses its permanent magnetic properties in the presence of high temperature or the repeated thermal cycling from room temperature to high temperature.

3. Susceptor Sustentation

As shown in FIG. 2a, the weight of susceptor 14 is sustained by the gas-pressure difference between the undersurface and the top surface of susceptor 14 with a gap h>0. This pressure difference is the result of resistance encountered by the gas flow from gas inlet 40 to edge 16 of susceptor 14. A equilibrium state is reached when gap h results in the correct amount of resistance encountered by the gas flow to produce the total gas-pressure difference between the undersurface and the top surface of susceptor 14, when integrated over the entire susceptor area, that is equal to the weight of susceptor 14 and any mass, for example an epitaxy sample, it supports on its top surface. Gas inlet 40 is placed as close as possible to the center of susceptor at shaft 20 to allow for even distribution of gas flow radially.

As shown in U.S. Pat. No. 4,860,687 to Frijlink, the basic configuration shown in FIG. 2a for susceptor sustentation does not allow large eccentricity of the mass supported by susceptor 14. The region of high gas-pressure difference between the undersurface and the top surface of susceptor 14 is concentrated near the center of susceptor 14, implying that the sustentation of susceptor 14 derives mainly from the center. This configuration can only be used with symmetric loads such as a circular disk or wafer or a concentrated load at the center of susceptor. More detailed discussion on this subject can be obtained from the above referenced patent.

Several improved systems of susceptor sustentation according to the invention are shown in FIGS. 4a, 4b, 4c, 4d, 4e, and 4f. The grooves are preferentially applied to reference surface 30 instead of the undersurface of susceptor 14 to minimize temperature variations in susceptor 14. It is known to those skilled in the art that if structures such as grooves are provided in the back surface of the sample carrier, the thermal image of these structures appears on the finished epitaxial layers in the form of homogeneity defects.

Figure 4A:
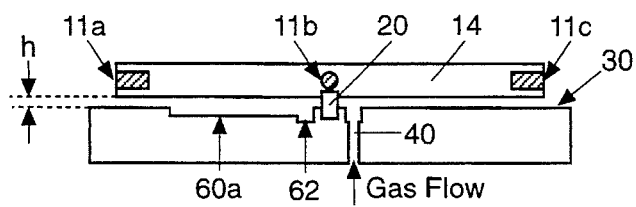
FIG. 4a is a sectional view of a second embodiment of a reference surface for susceptor sustentation according to the invention.
Figure 4B:
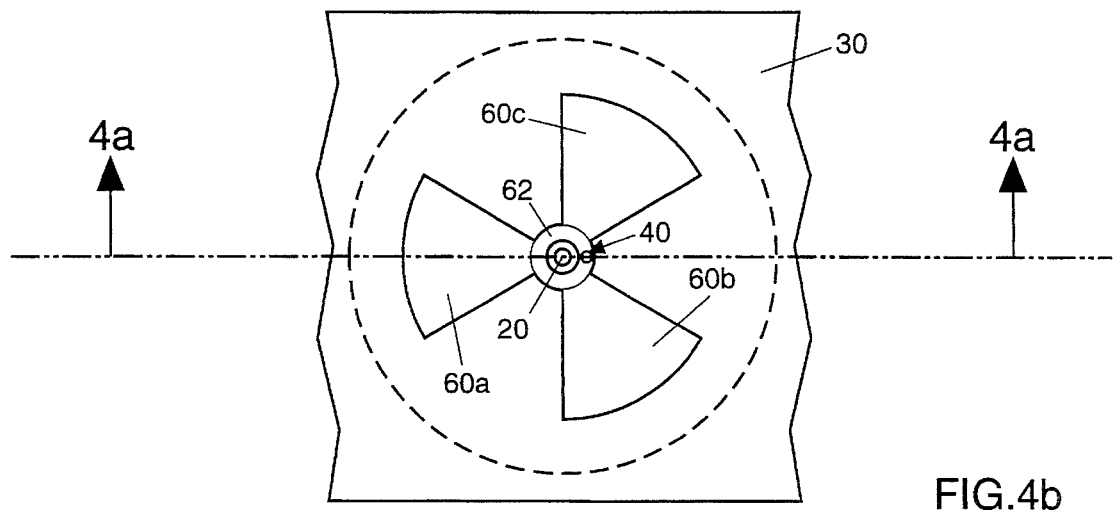
FIG. 4b is a plan view of the reference surface according to FIG. 4a, FIG. 4c is a sectional view of a third embodiment of a reference surface for susceptor sustentation according to the invention.

In FIGS. 4a and 4b, a gas inlet 40 supplies gas flow to an annular groove 62 that distributes the flow radially outward into three or more sector-shaped depressions or grooves 60a, 60b, and 60c. Positions of the grooves are deduced from each other by rotations of $2\pi/k$, where k=3 in this case.

Figure 4C:
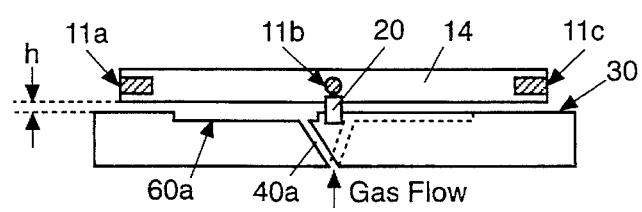
FIG. 4d is a plan view of the reference surface according to FIG. 4c.
FIG. 4e is a sectional view of a fourth embodiment of a reference surface for susceptor sustentation with an alternative rotary shaft according to the invention.
FIG. 4f is a plan view of the reference surface according to FIG. 4e.
Figure 4D:
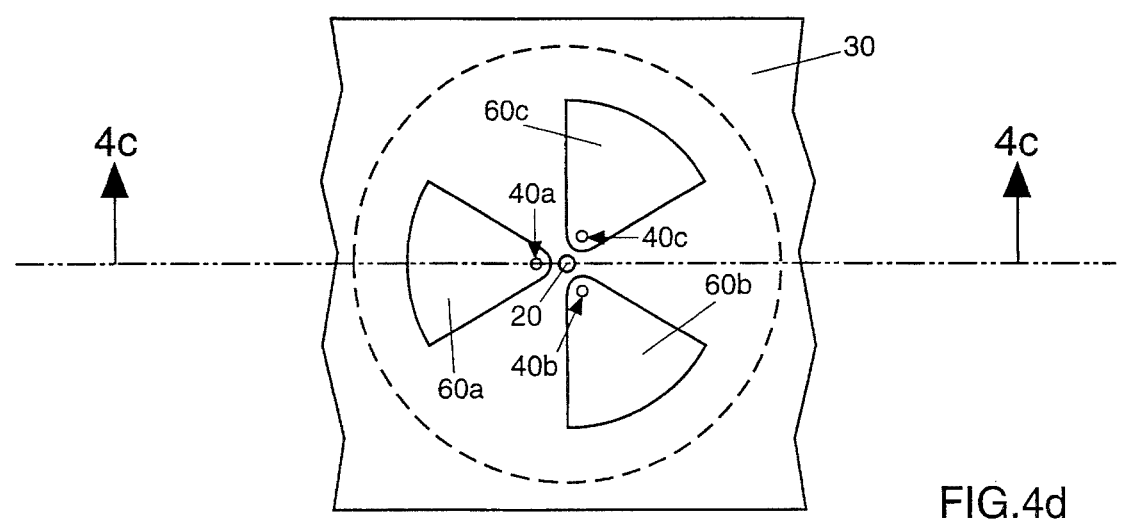

In FIGS. 4c and 4d, three or more gas inlets 40a, 40b, and 40c supply individual gas flows to three sector-shaped depressions or grooves 60a, 60b, and 60c. Positions of the grooves and gas inlets are deduced from each other by rotations of $2\pi/k$, where k=3 in this case.

Figure 4E:
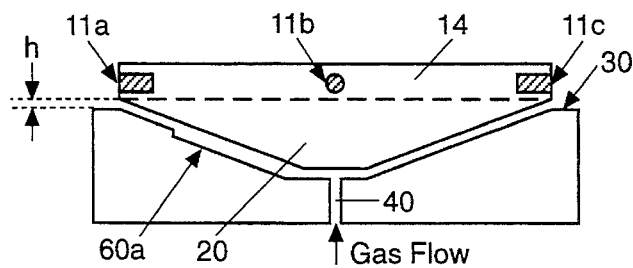
Figure 4F:
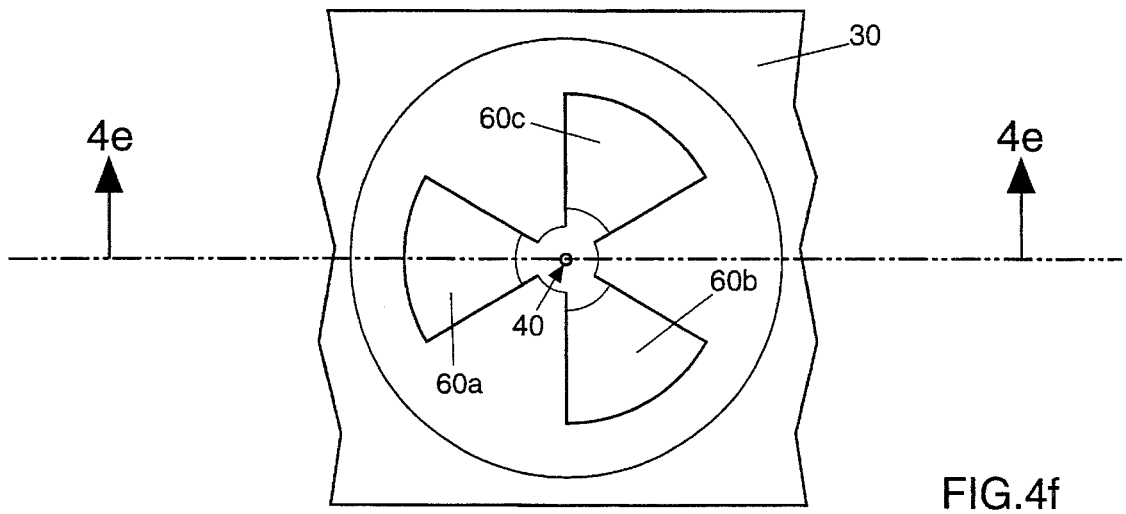

FIGS. 4e and 4f show a possible realization of an alternative form of a shaft 20 by a cut profile of a reference surface 30 and a complementary profile on the undersurface of susceptor 14. In this case, the cut profile is that of a circular cone truncated at the tip. A gas inlet 40 supplies gas flow to three sector-shaped depressions or grooves 60a, 60b, and 60c additionally formed on reference surface 30. Positions of the grooves are deduced from each other by rotations of $2\pi/k$, where k=3 in this case.

This form of sustentation does not require a separate shaft 20. However, manufacturing such a device require critical machining tolerances and difficult shaping procedures. Therefore it is considered as preferable to choose a localization of susceptor 14 by cylindrical rotary shaft 20.

These three structures achieve improved stability in susceptor sustentation by widening and equalizing the regions of higher pressure-differential between the undersurface and the top surface of susceptor 14. These regions of higher pressure-differential correspond approximately to where grooves 60a, 60b, 60c, and 62 are located. The transverse dimension of the grooves may be from one-tenth of a millimeter to several meters and their depth may be from ten micrometer to several centimeters.

Many other equivalent structures for susceptor sustentation, including one or more gas inlets and one or more grooves or depressions of various shape or profile can be made by those skilled in the art.

4. Magnetic Actuating Assembly and Operation of Complete Device

Magnetic actuating assembly 70, shown in FIGS. 2a and 2c as boxes, will be described in this section.

Figure 5:
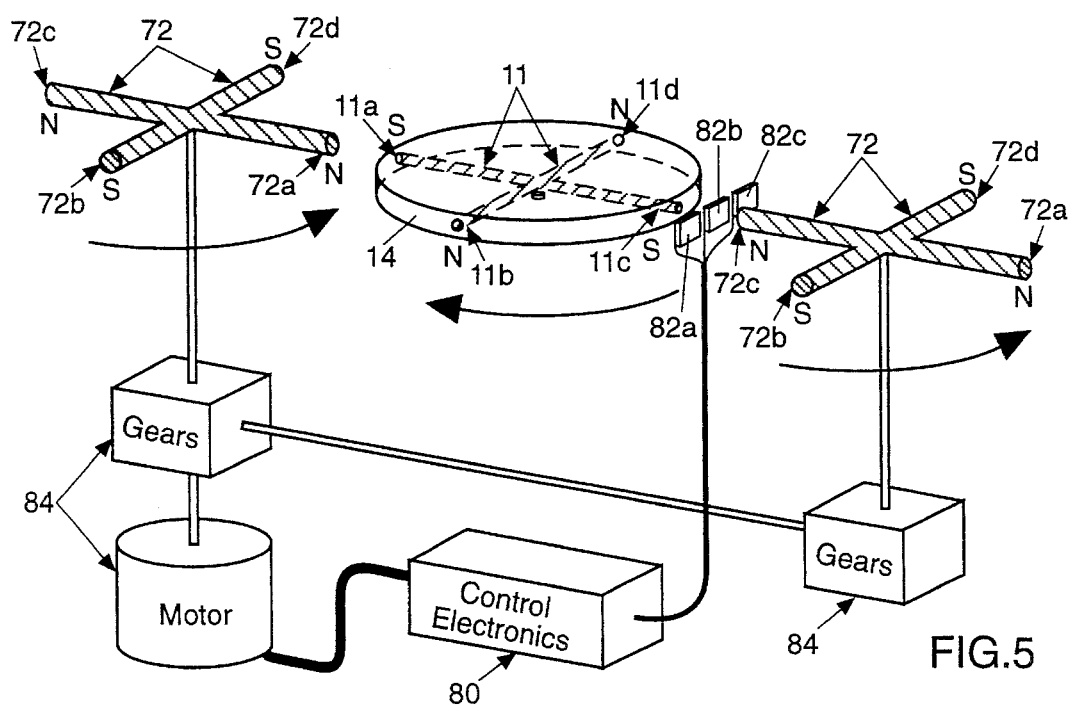
FIG. 5 is a perspective view of a rotating susceptor actuated by two external permanent-magnet rotors mechanically connected to a motor according to the invention.

FIG. 5 shows a non-preferred magnetic actuating assembly according to the invention. Two permanent magnetic rotors 72 with four poles 72a, 72b, 72c, and 72d is caused to rotate in the indicated direction by a system 84 of mechanical transmission means driven by motor means. The polarities of poles 72a, 72b, 72c, and 72d are indicated by the letters N and S. Possible locations for sensor means 82a, 82b, and 82c are also indicated. A susceptor 14 according to FIG. 3a is drawn to illustrate the operation. Rotors 72 cause susceptor 14 to rotate at the same rate in the indicated direction. The polarities of ferromagnetic elements 11a, 11b, 11c, and 11d is also indicated, if they are to be magnetized.

Two magnetic rotors are used at equal distance from susceptor 14 to balance the magnetic force exerted on susceptor 14. If only one rotor is used there would be strong lateral forces applied to susceptor 14 in addition to the forces necessary to induce susceptor rotation. Rotors 72 are placed in the plane of susceptor 14 on opposite ends of a diagonal through susceptor 14 to prevent the application of undesirable vertical forces to lift susceptor 14 or to put additional load on susceptor 14.

Additional control electronics 80 and sensor means 82a, 82b, and 82c can be added to monitor the actual rotation of susceptor 14 and to provide feedback allowing for the confirmation of rotation rate and angular position of susceptor.

The preferred magnetic actuating assembly is shown in FIGS. 6a, 6b, 6c, and 9 consisting of two or more magnetic solenoids 74a, 74b, 74c, 74d, 74e, and 74f arranged radially from the center of a susceptor 14. Possible locations for sensor means 82a, 82b, 82c, 82d, 82e, and 82f are also indicated. Also shown are a reference surface 30 and reactor-chamber walls 90. Ferromagnetic elements 11a, 11b, 11c, and 11d and susceptor sustentation means have been included for completeness and have been described in previous sections.

Figure 6A:
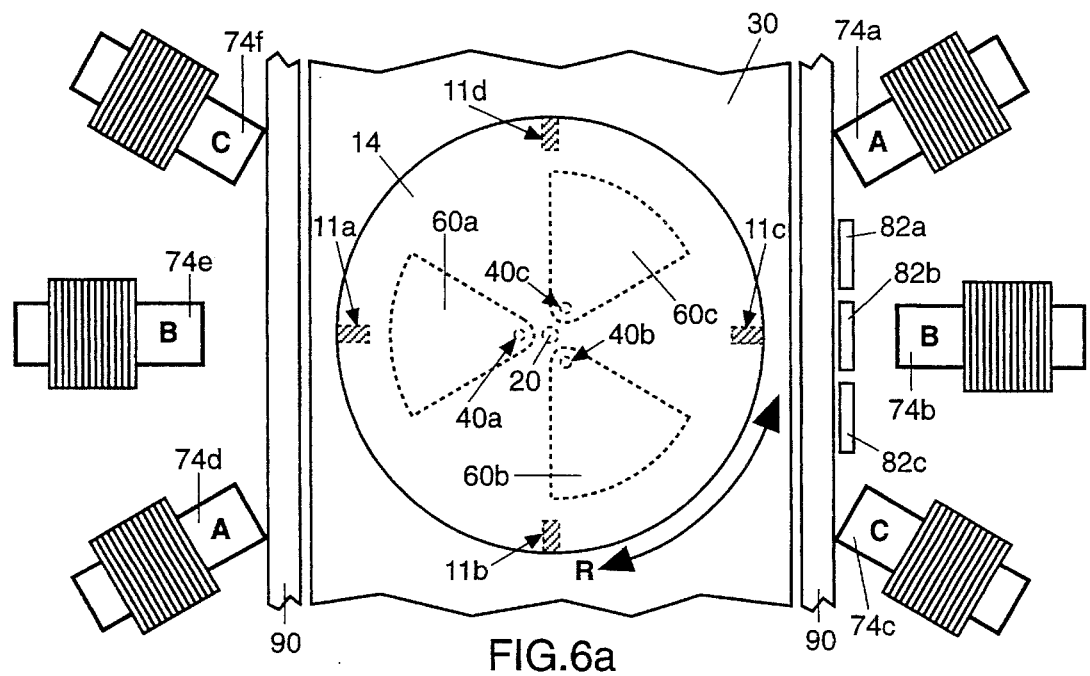
FIG. 6a is a plan view of an embodiment of a device according to the invention.
Figure 9:
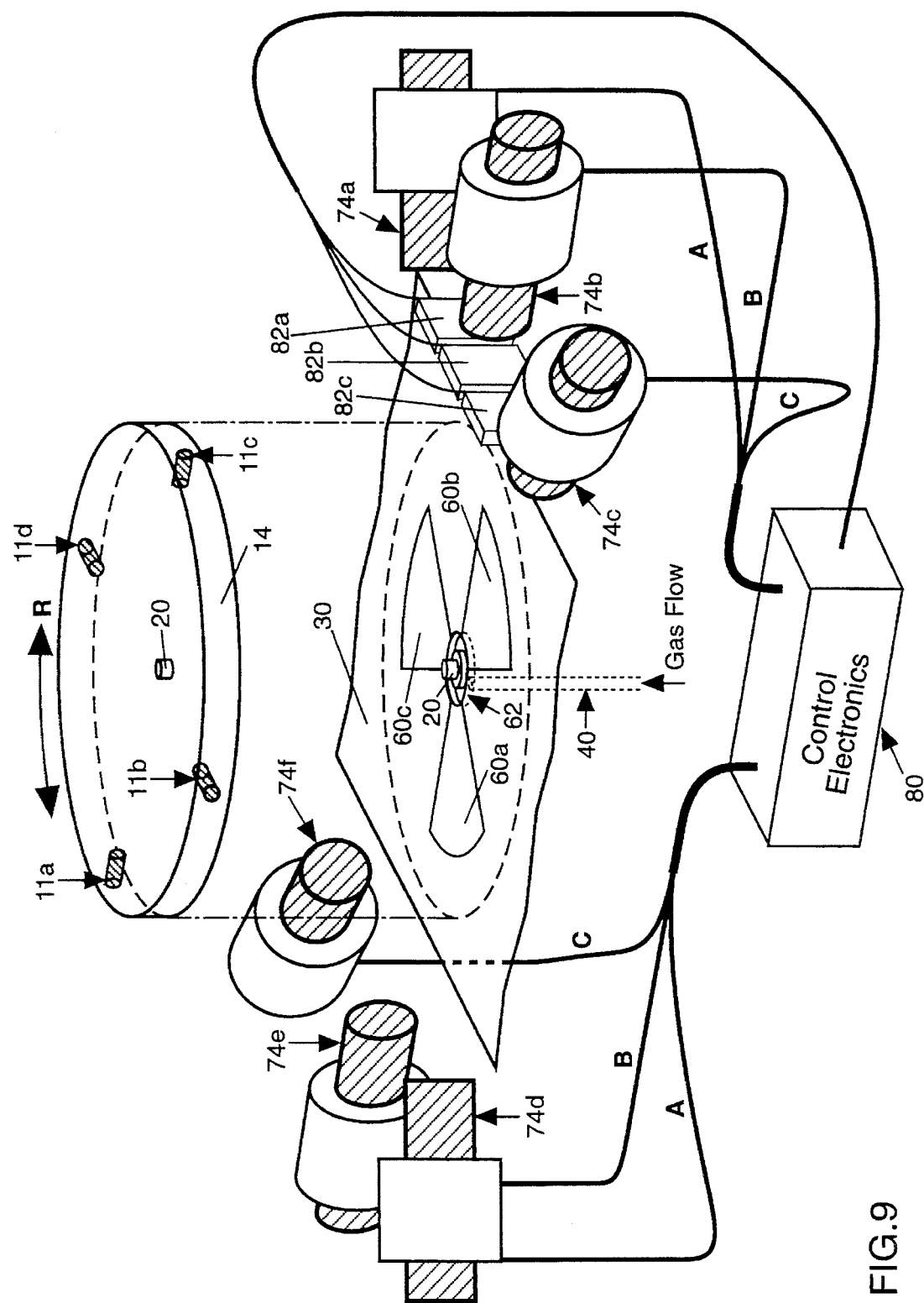
FIG. 9 is an exploded and perspective view of a preferred embodiment of a device according to the invention.

As shown in FIGS. 6a and 9, magnetic solenoids 74a, 74b, and 74c are arranged on one side of susceptor 14 and solenoids 74d, 74e, and 74f on the other side. The solenoids are approximately cylindrical in shape. The angular spacing between solenoids on each side is determined by the formula: $\Theta=2\pi/(n\cdot j)$, here n is the number of ferromagnetic elements on susceptor 14, and j is the number of magnetic solenoids on each side. For the case under discussion, $\Theta$ is $\pi/6$. The angular spacing $\Theta$ results in the efficient placement of magnetic solenoids on the outside of reactor-chamber wall 90, which is not shown in FIG. 9.

Figure 6B:
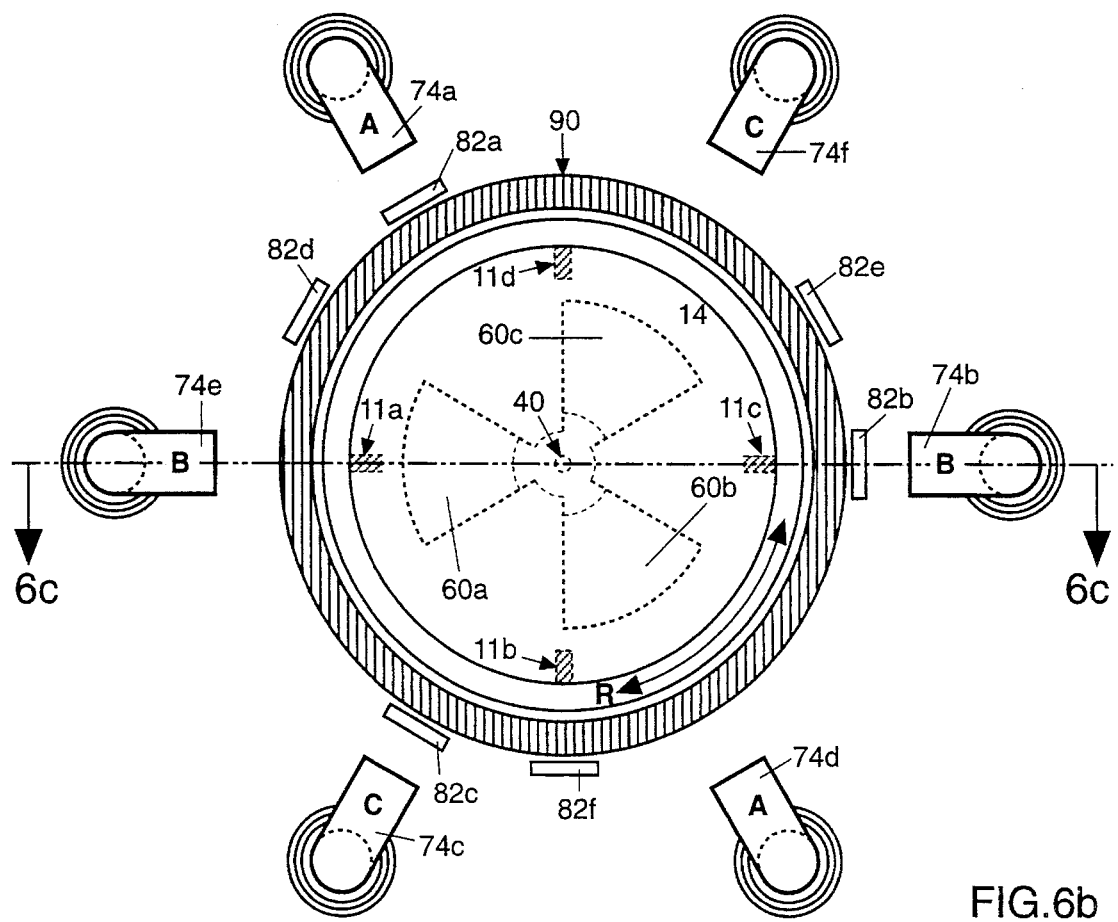
FIG. 6b is a plan view of an alternate embodiment of a device according to the invention.
Figure 6C:
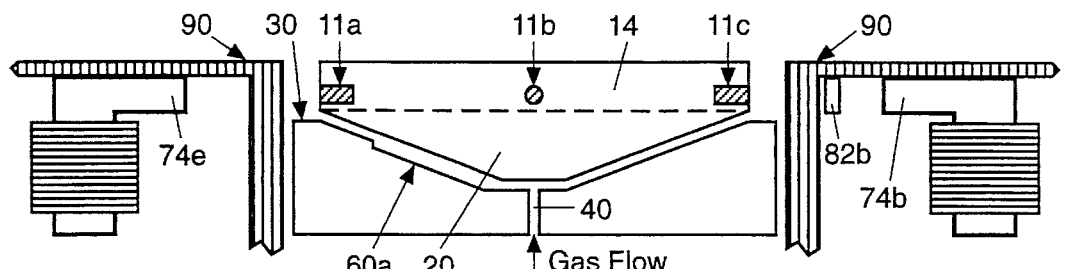
FIG. 6c is a sectional view of the device according to FIG. 6b.

As shown in FIGS. 6b and 6c, magnetic solenoids 74a, 74b, 74c, 74d, 74e, and 74f are arranged radially around a circular-reactor-chamber wall 90. Positions of the solenoids are deduced from each other by rotations of $2\pi/j$, where j=6 in this case. The solenoids are shaped like the letter L to create a flush surface in the same plane as the top surface of susceptor 14. This illustrates the adaptability of the invention to many different reactor chamber designs. Other arrangements of magnetic solenoids can be generated based on the information presented here and the specific application of the device.

Pairs of magnetic solenoids are used at equal distance from susceptor 14 to balance the magnetic force exerted on susceptor 14. If singular magnetic solenoids are used instead of pairs, there will be strong lateral forces applied to susceptor 14 in addition to forces necessary to induce susceptor rotation. Magnetic solenoids are placed in the plane of susceptor 14 on opposite ends of a diagonal through susceptor 14 to prevent the application of undesirable vertical forces to lift susceptor 14 or to put additional loads on susceptor 14.

Figure 8A:
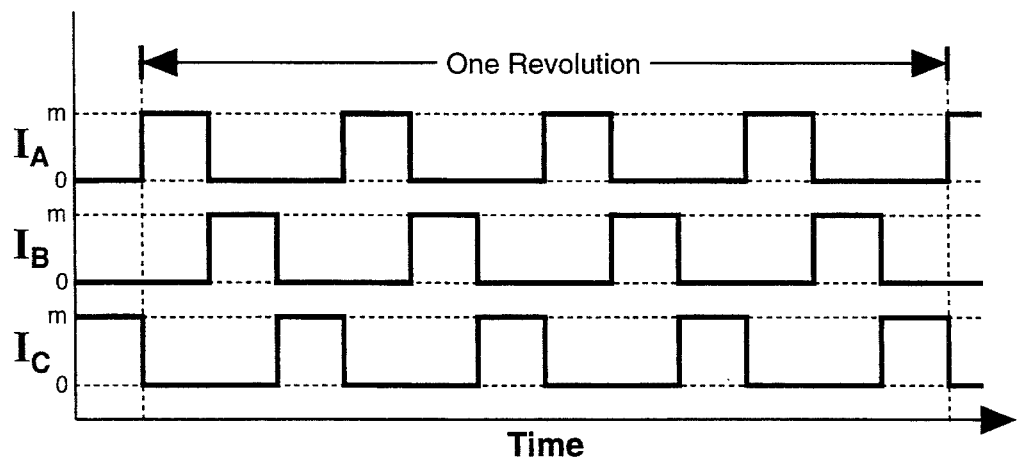
FIG. 8a is a graph of electrical currents $I_A$, $I_B$, and $I_C$ applied to different magnetic solenoids versus time for one revolution of susceptor rotation.

To cause rotation of susceptor 14 in the direction indicated by R, individual magnetic solenoids marked with letters A, B, or C on FIGS. 6a, 6b, or 9 are supplied with the appropriate current waveforms $I_A$, $I_B$, or $I_C$ as shown in FIG. 8a, where the currents change between 0 and m abruptly. The value of m for a particular device can be readily determined by those skilled in the art. The resulting rotation will have observable rotation steps with sudden acceleration and deceleration of rotation rates. The sequence for one revolution of susceptor 14 is indicated.

Figure 8B:
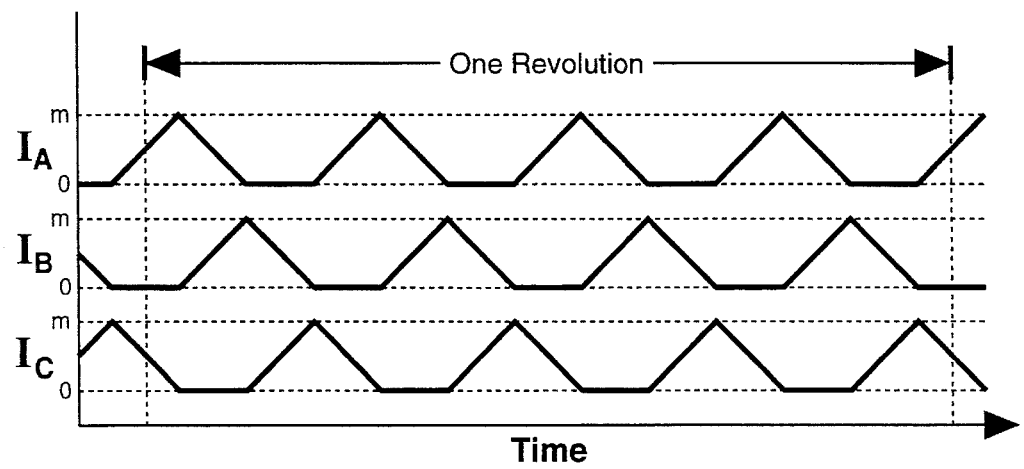
FIG. 8b is a graph of electrical currents $I_A$, $I_B$, and $I_C$ applied to different magnetic solenoids versus time for one revolution of susceptor rotation, with improved actuation characteristics.

With the improved waveforms $I_A$, $I_B$, and $I_C$ as shown in FIG. 8b, where the currents change between 0 and m smoothly, the resulting rotation will be much smoother with little or no jumps in rotation rates. This current waveforms may be produced electronically either by linear drive, where a smooth linear-varying voltage is applied to the solenoid, or by pulse-width modulated drive, where a train of pulses of constant height in voltage of varying width and/or duty cycle is applied. To reverse the direction of rotation, just apply waveforms $I_A$ to solenoid C and waveforms $I_C$ to solenoid A.

Control electronics 80 and sensor means 82a, 82b, 82c, 82d, 82e, and 82f can be added to monitor the actual rotation of susceptor 14 and to provide feedback allowing for the confirmation of rotation rate and angular position of susceptor.

Figure 7A:
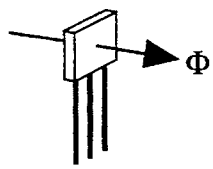
FIG. 7a is a perspective view of a magnetic flux sensing device based on the Hall effect.
Figure 7B:
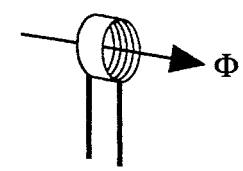
FIG. 7b is a perspective view of a magnetic flux sensing device based on the generation of electromotive force in a coil by magnetic induction.
Figure 7C:
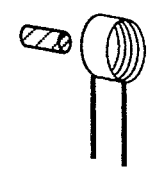
FIG. 7c is a perspective view of a metal sensing device based on the changes of coil inductance in the presence of metal.

Several possible sensor means are shown in FIGS. 7a, 7b, and 7c. FIG. 7a shows a magnetic-flux sensing device based on the Hall effect produced on a semiconductor chip, where the magnetic flux strength indicated by Φ is converted relatively proportionally into an output voltage. FIG. 7b shows a magnetic-flux sensing device, consisting of coils of electrical conductors, that generates an output voltage proportional to the time-rate change in the magnetic flux indicated by Φ. FIG. 7c shows the same coil used in a different way to sense metal by measuring the coil-inductance changes induced by the presence of metal.

These sensors can be placed at the specified locations to detect the presence of ferromagnetic elements 11a, 11b, 11c, or 11d, to confirm the relative angular position or rotation rate of susceptor 14. Relative angular position can be determined because the position of ferromagnetic elements are known when the susceptor is made. The rotation rate can be determined simply by counting the number of elements detected in a given amount of time or by measuring the time elapsed between elements. These two measurements can be as accurate as the sensor means and the control electronics would allow.

Addition of the sensor means would allow certain amount of fault-correction. For example, if susceptor rotation is slower than expected as measured by the sensing means, then control electronics can alert a human operator or temporarily increase the drive currents m of the solenoids to try compensate for any additional loads or changes in the device. Operation of the device according to the invention can be made even more reliable with the sensors in place.

5. Planetary Device

Figure 10A:
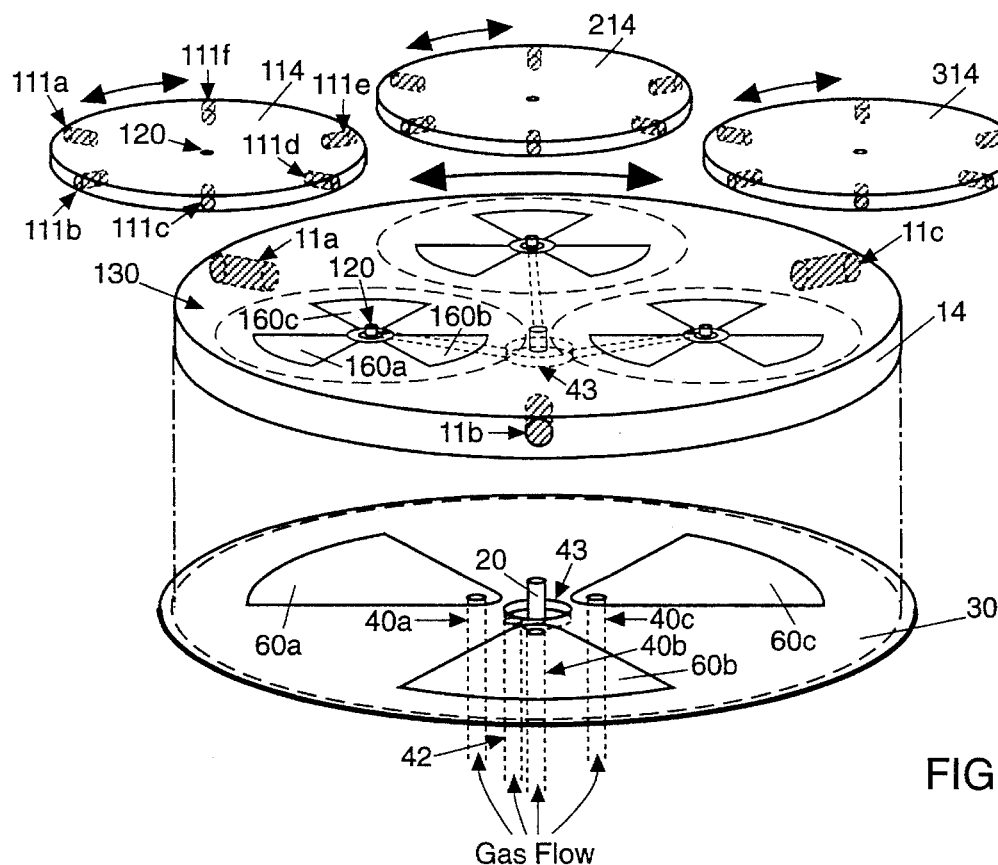
FIG. 10a is an exploded and perspective view of a device permitting the planetary rotation of several susceptors not showing the magnetic actuating assembly, according to the invention.
Figure 10B:
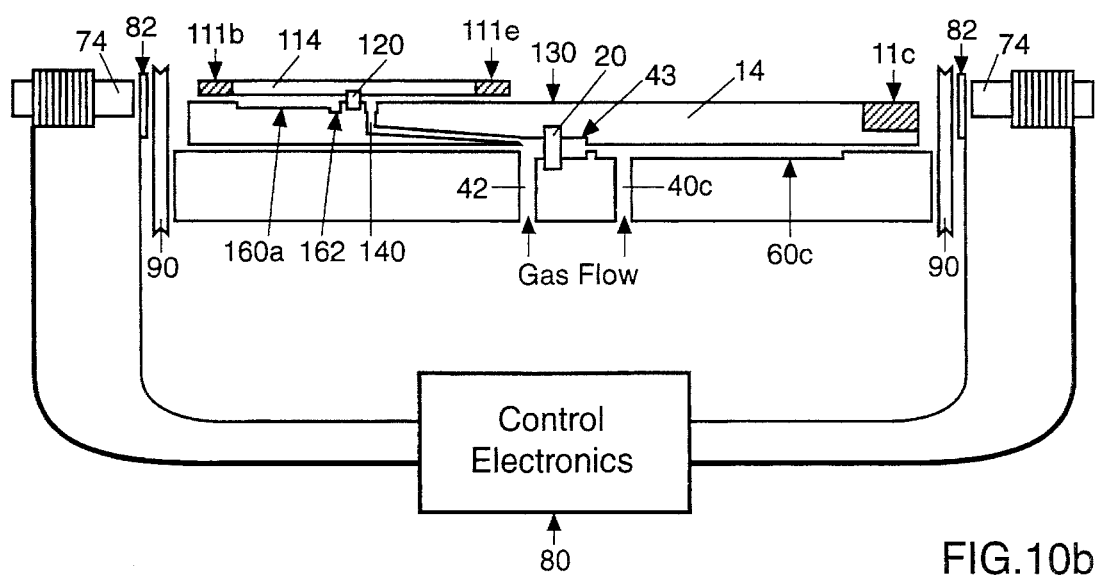
Figure 10C:
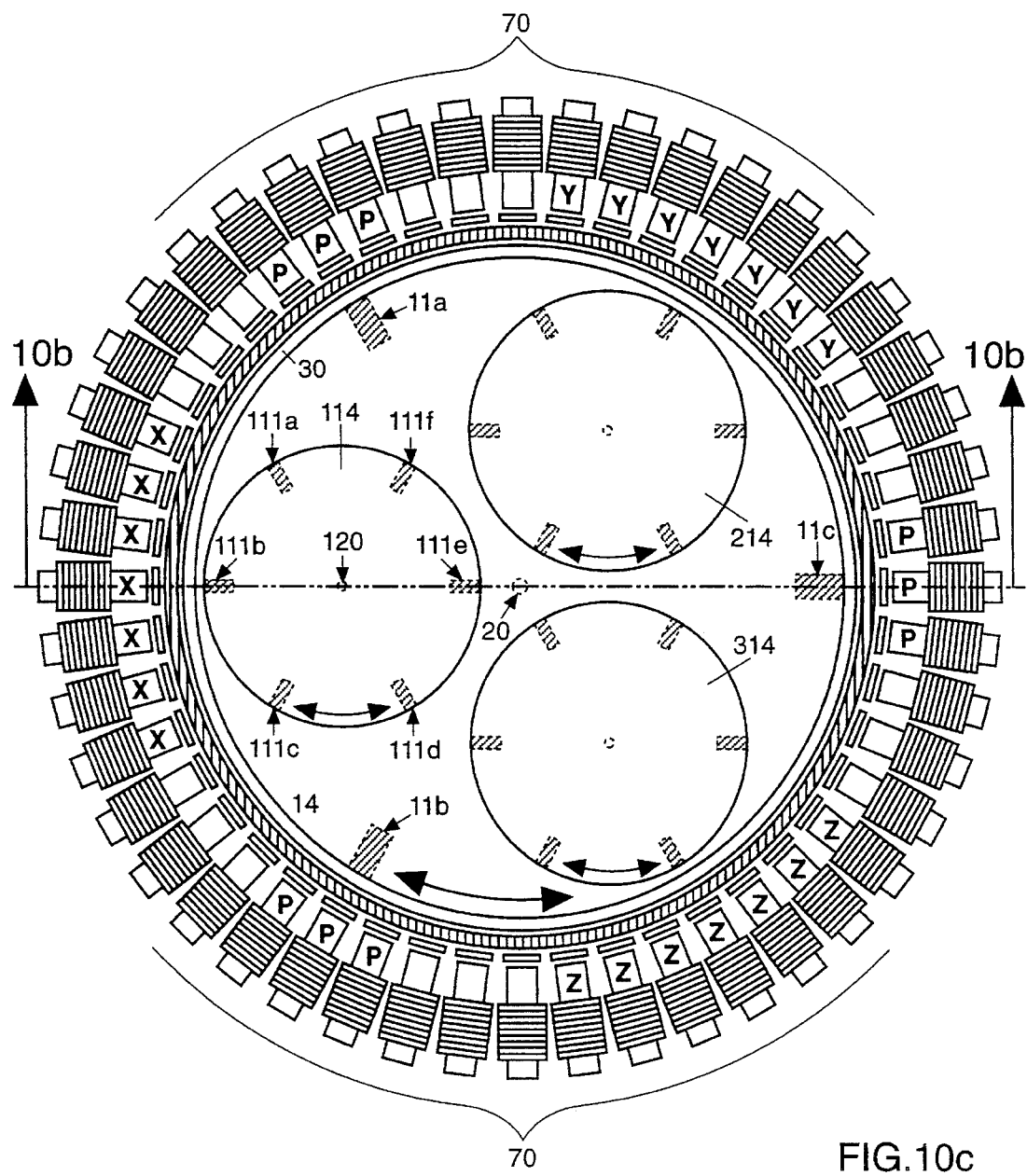

FIGS. 10a, 10b, and 10c show a planetary form of susceptor rotation according to the invention. A main susceptor 14 with three ferromagnetic elements 11a, 11b, and 11c rotates parallel to a reference surface 30 about a shaft 20 perpendicular to this surface. Main susceptor 14 is held in sustentation by the action of gas flow through gas inlets 40a, 40b, 40c into sector-shaped depressions or grooves 60a, 60b, and 60c. Main susceptor 14 is caused to rotate in the indicated directions by interactions between ferromagnetic elements 11a, 11b, and 11c and a magnetic actuating assembly 70 containing 48 magnetic solenoids 74 and optionally 48 sensor means 82. A circular reactor-chamber wall 90 is also shown.

Main susceptor 14 also includes a number of secondary susceptors 114, 214, and 314 on a reference surface 130 facing away from reference surface 30. Secondary susceptor 114 is used as an example applicable to secondary susceptors 214 and 314. Secondary susceptor 114 contain six ferromagnetic elements 111a, 111b, 111c, 111d, 111e, and 111f. Secondary susceptor 114 is held in sustentation by the action of gas flow through an additional gas inlet 42 in reference surface 30, a system of gas conduits 43, and a gas inlet 140 into an annular groove 162 connected to several sector-shaped depressions or grooves 160a, 160b, and 160c on reference surface 130. Similarly, secondary susceptors 114, 214, and 314 are caused to rotate in the indicated directions by interactions between their respective ferromagnetic elements and magnetic actuating assembly 70.

Understanding and utilization of this planetary device is aided by the letters P, X, Y, and Z indicated on the individual magnetic solenoids within magnetic actuating assembly 70. Individual magnetic solenoids 74 are under the control of control electronics 80. Optionally, sensors 82 are also connected to control electronics 80.

Solenoids 74 marked with P are responsible for the rotation of main susceptor 14 at this moment in time. Solenoids 74 marked with X are responsible for the rotation of secondary susceptor 114 at this moment in time. Solenoids 74 marked with Y are responsible for the rotation of secondary susceptor 214 at this moment in time. Solenoids 74 marked with Z are responsible for the rotation of secondary susceptor 314 at this moment in time. Current waveforms illustrated in FIGS. 8a or 8b can be applied to these solenoids with minor modifications easily done by those well-versed in the art. The positions of these letters P, X, Y, and Z shift in time to correspond to the angular orientation of main susceptor 14. The rotation rates of individual susceptors 14, 114, 214, and 314 can be independently controlled in this fashion, allowing for extremely complicated rotation patterns. With the inclusion of optional sensors 82, rotation rates and angular orientation of individual susceptors can be confirmed and measured, allowing for possible immediate corrections by control electronics 80 or a human operator.

SUMMARY, RAMIFICATION, AND SCOPE OF THE INVENTION

Accordingly, versatile devices comprising one or more rotating platforms and means for obtaining individual rotation of the platforms have been described. Many constraints of prior-art devices have been eliminated.

(a) No constraint on minimum rotation rate.
(b) Escaping gases that disturb the gas flow over the platform are minimized.
(c) Rotation rates of platforms can be determined essentially exactly.
(d) Perfect matching of rotation rates between individual platforms in the planetary device is an inherent characteristic.

(e) The process of starting and stopping rotation generates no contaminating particles.

(f) Synchronization of rotation with external events is simple.

While my above description contains many specificities, these should not be construed as limitations on the scope of the invention, but rather as an exemplification of one preferred embodiment thereof. Many other variations are possible. For example, the ferromagnetic elements may be square or oval. The platform may be a square, a polygon, or shaped to fit a particular workpiece. Instead of being shaped like sectors, the grooves on the reference surface can be stripes, patches, concentric annular rings and many other combinations to achieve similar effects in susceptor sustentation. The design of the magnetic actuating assembly allows an enormous amount of freedom to adapt to specific applications, such as water-cooling for magnetic solenoids, integration of solenoids into the reactor-chamber wall, or improved magnetic circuits to allow for better efficiency.

Accordingly, the scope of the invention should be determined not by the embodiments illustrated, but by the appended claims and their legal equivalents.

I claim:

1. A device comprising a reference surface having at least one gas inlet, a flat susceptor disk rotating parallel to said reference surface, said disk being supported from said reference surface by flow of gas from said inlet, said inlet in said reference surface being within the periphery of said disk, a rotary shaft perpendicular to said reference surface, said rotary shaft being cylindrical with a small diameter relative to a diameter of said disk, and said rotary shaft being disposed between said reference surface and said disk at the center of symmetry of said disk, at least one ferromagnetic element integrated within said disk, said element being of a volume smaller than said disk, a magnetic actuating means to supply magnetic fields to interact with said element, wherein said disk is maintained at a separation distance h greater than zero from said reference surface by said flow of gas, wherein rotary movement of said disk is obtained by a force of magnetic interaction between said element and said magnetic actuating means.

2. A device according to claim 1, wherein said disk includes a number of secondary susceptor disks on a surface facing away from said reference surface, said secondary disks being of a diameter smaller than said flat susceptor disk, and said secondary disks being separated from one another by a rotational distance of $2\pi/n'$, where n' equals the number of secondary disks, said secondary disks include at least one ferromagnetic element integrated within each said secondary disk, and wherein rotary movements of said secondary disks are obtained by forces of magnetic interaction between said elements of said secondary disks and said magnetic actuating means.

3. A device comprising a reference surface, a rotatable platform, said platform being supported from said reference surface by a rotary bearing means, at least one ferromagnetic element integrated within said platform, said element being of a volume smaller than said platform, a magnetic actuating means to supply magnetic fields to interact with said element, wherein rotary movement of said platform is obtained by a force of magnetic interaction between said element and said magnetic actuating means.

4. A device according to claim 3, wherein said platform includes a number of secondary platforms, said secondary platforms include at least one ferromagnetic element integrated within each said secondary platform, and wherein rotary movements of said secondary platforms are obtained by forces of magnetic interaction between said elements of said secondary platforms and said magnetic actuating means.

5. A device comprising a reference surface having at least one fluid inlet, a rotable susceptor, said susceptor being supported from said reference surface by flow of fluid from said inlet, said inlet in said reference surface being within the periphery of said susceptor, a rotary shaft means to prevent lateral movement of said susceptor, at least one ferromagnetic element integrated within said susceptor, said element being of a volume smaller than said susceptor, a magnetic actuating means to supply magnetic fields to interact with said element, wherein said susceptor is maintained at a separation distance h greater than zero from said reference surface by said flow of fluid, wherein rotary movement of said susceptor is obtained by a force of magnetic interaction between said element and said magnetic actuating means.

6. A device according to claim 5, wherein said susceptor includes a number of secondary susceptors on a surface facing away from said reference surface, said secondary susceptors include at least one ferromagnetic element integrated within each said secondary susceptor, and wherein rotary movements of said secondary susceptors are obtained by forces of magnetic interaction between said elements of said secondary susceptors and said magnetic actuating means.

7. A device comprising a reference surface having at least one fluid inlet, a rotable susceptor, said susceptor being supported from said reference surface by flow of fluid from said inlet, said inlet in said reference surface being within the periphery of said susceptor, said susceptor being supported laterally also by flow of fluid from said inlet to prevent lateral movement of said susceptor, at least one ferromagnetic element integrated within said susceptor, said element being of a volume smaller than said susceptor, a magnetic actuating means to supply magnetic fields to interact with said element, wherein said susceptor is maintained at a separation distance h greater than zero from said reference surface by said flow of fluid, wherein rotary movement of said susceptor is obtained by a force of magnetic interaction between said element and said magnetic actuating means.

8. A device according to claim 7, wherein said susceptor includes a number of secondary susceptors on a surface facing away from said reference surface, said secondary susceptors include at least one ferromagnetic element integrated within each said secondary susceptor, and wherein rotary movements of said secondary susceptors are obtained by forces of magnetic interaction between said elements of said secondary susceptors and said magnetic actuating means.

9. A device comprising a reference surface having at least one gas inlet, a susceptor rotating parallel to said reference surface, said susceptor being supported from said reference surface by flow of gas from said inlet, said inlet in said reference surface being within the periphery of said susceptor, a rotary shaft perpendicular to said reference surface, said rotary shaft being cylindrical with a small diameter relative to a diameter of said susceptor, and said rotary shaft being disposed between said reference surface and said susceptor at the center of symmetry of said susceptor, at least one ferromagnetic element integrated within said susceptor, said element being of a volume smaller than said susceptor, a magnetic actuating means to supply magnetic fields to interact with said element, wherein said susceptor is maintained at a separation distance h greater than zero from said reference surface by said flow of gas, wherein rotary movement of said susceptor is obtained by a force of magnetic interaction between said element and said magnetic actuating means.

10. A device according to claim 9, wherein said susceptor includes a number of secondary susceptors on a surface facing away from said reference surface, said secondary susceptors being of a area smaller than said susceptor, and said secondary susceptors being separated from one another by a rotational distance of $2\pi/n'$, where n' equals the number of secondary susceptors, said secondary susceptors include at least one ferromagnetic element integrated within each said secondary susceptor, and wherein rotary movements of said secondary susceptors are obtained by forces of magnetic interaction between said elements of said secondary susceptors and said magnetic actuating means.

11. A device comprising a reference surface having at least one gas inlet, a susceptor rotating parallel to said reference surface, said susceptor being supported from said reference surface by flow of gas from said inlet, said inlet in said reference surface being within the periphery of said susceptor, said susceptor being supported laterally also by flow of gas from said inlet to prevent lateral movement of said susceptor, at least one ferromagnetic element integrated within said susceptor, said element being of a volume smaller than said susceptor, a magnetic actuating means to supply magnetic fields to interact with said element, wherein said susceptor is maintained at a separation distance h greater than zero from said reference surface by said flow of gas, wherein rotary movement of said susceptor is obtained by a force of magnetic interaction between said element and said magnetic actuating means.

12. A device according to claim 11, wherein said susceptor includes a number of secondary susceptors on a surface facing away from said reference surface, said secondary susceptors being of a area smaller than said susceptor, and said secondary susceptors being separated from one another by a rotational distance of $2\pi/n'$, where n' equals the number of secondary susceptors, said secondary susceptors include at least one ferromagnetic element integrated within each said secondary susceptor, and wherein rotary movements of said secondary susceptors are obtained by forces of magnetic interaction between said elements of said secondary susceptors and said magnetic actuating means.

* * * * *